United States Patent
Davidson et al.

(10) Patent No.: US 8,202,566 B2
(45) Date of Patent: *Jun. 19, 2012

(54) METHOD OF PRODUCING AN ELECTRONIC UNIT HAVING A POLYDIMETHYLSILOXANE SUBSTRATE AND CIRCUIT LINES

(75) Inventors: James Courtney Davidson, Livermore, CA (US); Peter A. Krulevitch, Pleasanton, CA (US); Mariam N. Maghribi, Livermore, CA (US); William J. Benett, Livermore, CA (US); Julie K. Hamilton, Tracy, CA (US); Armando R. Tovar, San Antonio, TX (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 1437 days.

This patent is subject to a terminal disclaimer.

(21) Appl. No.: 11/243,302

(22) Filed: Oct. 3, 2005

(65) Prior Publication Data

US 2006/0029731 A1    Feb. 9, 2006

Related U.S. Application Data

(62) Division of application No. 10/371,912, filed on Feb. 20, 2003, now Pat. No. 7,005,179.

(60) Provisional application No. 60/398,702, filed on Jul. 26, 2002.

(51) Int. Cl.
    *B05D 5/12* (2006.01)

(52) U.S. Cl. .................. 427/97.7; 427/98.4; 427/117

(58) Field of Classification Search .................. 427/58, 427/96.1, 97.7, 98.4, 117
See application file for complete search history.

(56) References Cited

U.S. PATENT DOCUMENTS

| | | | |
|---|---|---|---|
| 4,337,289 A * | 6/1982 | Reed et al. ............... | 428/211.1 |
| 4,519,760 A * | 5/1985 | Norell ........................ | 425/113 |
| 5,047,283 A | 9/1991 | Leatherman et al. | |
| 5,346,850 A | 9/1994 | Kaschmitter et al. | |
| 5,395,481 A | 3/1995 | McCarthy | |
| 5,414,276 A | 5/1995 | McCarthy | |
| 5,512,131 A | 4/1996 | Kumar et al. | |
| 5,817,550 A | 10/1998 | Carey et al. | |
| 6,103,033 A * | 8/2000 | Say et al. .................. | 156/73.1 |
| 6,238,538 B1 * | 5/2001 | Parce et al. .................. | 204/600 |
| 6,296,174 B1 * | 10/2001 | Chiang ..................... | 228/214 |

(Continued)

FOREIGN PATENT DOCUMENTS

EP    0 340 376 A1    11/1989

(Continued)

OTHER PUBLICATIONS

Knobloch, A., et al., "Printed Polymer Transistors," First International IEEE Conference on Polymers and Adhesives in Microelectronics and Photonics, Incorporating Poly, Pep & Adhesives in Electronics Proceedings, Potsdam, Germany, Oct. 21-24, 2001, Oct. 21, 2001, pp. 84-90.

*Primary Examiner* — Brian K Talbot
(74) *Attorney, Agent, or Firm* — Eddie E. Scott

(57) ABSTRACT

A system of metalization in an integrated polymer microsystem. A flexible polymer substrate is provided and conductive ink is applied to the substrate. In one embodiment the flexible polymer substrate is silicone. In another embodiment the flexible polymer substrate comprises poly(dimethylsiloxane).

5 Claims, 3 Drawing Sheets

U.S. PATENT DOCUMENTS

| | | |
|---|---|---|
| 6,324,429 B1 | 11/2001 | Shire et al. |
| 6,413,790 B1 | 7/2002 | Duthaler et al. |
| 6,506,438 B2 * | 1/2003 | Duthaler et al. ................ 427/58 |
| 6,596,569 B1 | 7/2003 | Bao et al. |
| 6,697,694 B2 * | 2/2004 | Mogensen .................... 700/119 |
| 6,772,515 B2 * | 8/2004 | Suwa et al. ...................... 29/847 |
| 6,946,332 B2 * | 9/2005 | Loo et al. ...................... 438/149 |
| 7,036,220 B2 * | 5/2006 | Davidson et al. ............... 29/846 |
| 2002/0050220 A1 | 5/2002 | Schueller et al. |
| 2002/0079219 A1 | 6/2002 | Zhao et al. |
| 2002/0160561 A1 * | 10/2002 | Ouellet et al. ................ 438/201 |
| 2003/0097166 A1 * | 5/2003 | Krulevitch et al. ........... 607/116 |

FOREIGN PATENT DOCUMENTS

| | | |
|---|---|---|
| EP | 0 935 288 A2 | 11/1999 |
| GB | 2253856 * | 9/1992 |
| WO | WO 99/16601 A1 | 4/1999 |
| WO | WO 01/41517 A1 | 6/2001 |
| WO | WO 01/89787 A2 | 11/2001 |

* cited by examiner

METHOD OF PRODUCING AN ELECTRONIC UNIT HAVING A POLYDIMETHYLSILOXANE SUBSTRATE AND CIRCUIT LINES

CROSS-REFERENCE TO RELATED APPLICATIONS

This application is a division of application Ser. No. 10/371,912 filed Feb. 20, 2003, and titled "Conductive Inks for Metalization in Integrated Polymer Microsystems," now U.S. Pat. No. 7,005,179 issued Feb. 28, 2006, and claims the benefit of U.S. Provisional Application No. 60/398,702 filed Jul. 26, 2002 and titled "Conductive Inks for Multilevel Metalization in Stretchable Integrated Polymer Microsystems." U.S. Provisional Application No. 60/398,702 filed Jul. 26, 2002 and titled "Conductive Inks for Multilevel Metalization in Stretchable Integrated Polymer Microsystems" now U.S. Pat. No. 7,005,179 issued Feb. 28, 2006, is incorporated herein by this reference.

The United States Government has rights in this invention pursuant to Contract No. W-7405-ENG-48 between the United States Department of Energy and the University of California for the operation of Lawrence Livermore National Laboratory.

BACKGROUND

1. Field of Endeavor

The present invention relates to electronics and more particularly to metalization in integrated polymer Microsystems.

2. State of Technology

U.S. Pat. No. 5,817,550 for a method for formation of thin film transistors on plastic substrates to Paul G. Carey, Patrick M. Smith, Thomas W. Sigmon, and Randy C. Aceves, issued Oct. 6, 1998, assigned to Regents of the University of California, provides the following background information, "Recently a process was developed for crystallizing and doping amorphous silicon on a low cost, so-called low-temperature plastic substrate using a short pulsed high energy source in a selected environment, without heat propagation and build-up in the substrate so as to enable use of plastic substrates incapable of withstanding sustained processing temperatures higher than about 180° C. Such a process is described and claimed in U.S. Pat. No. 5,346,850 issued Sep. 13, 1994 to J. L. Kaschmitter et al., assigned to the Assignee of the instant application. Also, recent efforts to utilize less expensive and lower temperature substrates have been carried out wherein the devices were formed using conventional temperatures on a sacrificial substrate and then transferred to another substrate, with the sacrificial substrate thereafter removed. Such approaches are described and claimed in U.S. Pat. No. 5,395,481 issued Mar. 7, 1995, U.S. Pat. No. 5,399,231 issued Mar. 21, 1995, and U.S. Pat. No. 5,414,276 issued May 9, 1995, each issued to A. McCarthy and assigned to the assignee of the instant application."

U.S. Pat. No. 6,324,429 for a chronically implantable retinal prosthesis by Doug Shire, Joseph Rizzo, and John Wyatt, of the Massachusetts Eye and Ear Infirmary Massachusetts Institute of Technology issued Nov. 27, 2001 provides the following information, "In the human eye, the ganglion cell layer of the retina becomes a monolayer at a distance of 2.5-2.75 mm from the foveola center. Since the cells are no longer stacked in this outer region, this is the preferred location for stimulation with an epiretinal electrode array. The feasibility of a visual prosthesis operating on such a principle has been demonstrated by Humayun, et al. in an experiment in which the retinas of patients with retinitis pigmentosa, age-related macular degeneration, or similar degenerative diseases of the eye were stimulated using bundles of insulated platinum wire."

SUMMARY

Features and advantages of the present invention will become apparent from the following description. Applicants are providing this description, which includes drawings and examples of specific embodiments, to give a broad representation of the invention. Various changes and modifications within the spirit and scope of the invention will become apparent to those skilled in the art from this description and by practice of the invention. The scope of the invention is not intended to be limited to the particular forms disclosed and the invention covers all modifications, equivalents, and alternatives falling within the spirit and scope of the invention as defined by the claims.

The present invention provides a system of metalization in an integrated flexible polymer microsystem. A flexible polymer substrate is provided and conductive ink is applied to the substrate. In one embodiment the flexible polymer substrate is silicone. In another embodiment the flexible polymer substrate comprises poly(dimethylsiloxane). In one embodiment an electronic apparatus is produced comprising a flexible polymer substrate and circuit lines operatively connected to the flexible polymer substrate wherein the circuit lines are produced by the method comprising the step of applying conductive ink to the substrate.

The invention is susceptible to modifications and alternative forms. Specific embodiments are shown by way of example. It is to be understood that the invention is not limited to the particular forms disclosed. The invention covers all modifications, equivalents, and alternatives falling within the spirit and scope of the invention as defined by the claims.

BRIEF DESCRIPTION OF THE DRAWINGS

The accompanying drawings, which are incorporated into and constitute a part of the specification, illustrate specific embodiments of the invention and, together with the general description of the invention given above, and the detailed description of the specific embodiments, serve to explain the principles of the invention.

DETAILED DESCRIPTION OF THE INVENTION

Figure 1:
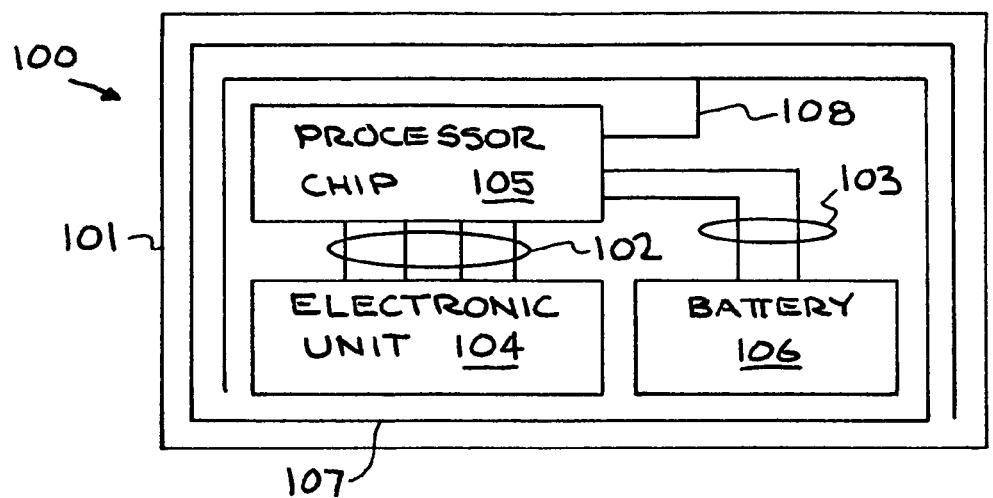
FIG. 1 illustrates an embodiment of a system incorporating the present invention.

Referring now to the drawings, to the following detailed description, and to incorporated materials; detailed information about the invention is provided including the description of specific embodiments. The detailed description serves to explain the principles of the invention. The invention is susceptible to modifications and alternative forms. The invention is not limited to the particular forms disclosed. The invention covers all modifications, equivalents, and alternatives falling within the spirit and scope of the invention as defined by the claims.

Referring now to in FIG. 1, an embodiment of a system constructed in accordance with the present invention is illustrated. The system is generally designated by the reference numeral 100. As shown in FIG. 1, an electronic unit 104, a processor chip 105, a battery 106, and an antenna 107 are connected by a circuit integrated onto a PDMS substrate 101. The circuit interconnect is comprised of circuit lines 102, 103, and 108.

The substrate 101 comprises a poly(dimethylsiloxane) (PDMS) substrate that serves as a platform for integrating and packaging the individual components. The electronic unit 104 can be a wide variety of electronic devices. Examples of some of the electronic devices that are utilized in different embodiments of the invention include the following: electrode array, implantable medical device, radio, recorder, recorder and player, video camera, video player, video recorder, video recorder and player, cell phone, computer, calculator, phone tap, gadget that detects phone taps, audio surveillance device, medical device, biosensor, radiation monitor, power source, battery, solar cell, wireless electronics for communication, capacitor, resistor, inductor, transformer, light-emitting diode, optical detector, optical encoder, integrated circuit, microprocessor, digital to analog converter, display, camera, cell phone, and other electronic devices. Devices are attached to an activated flexible polymer substrate. In the case of PDMS substrates both the substrate and the device passivating oxide are cleaned in ethanol prior to an oxygen plasma. Devices are then permanently bonded to the substrate upon contact.

In order for the PDMS substrate 101 to be an ideal, low cost, integration and packaging platform, demonstration of metalization to create the circuit lines 102, 103, and 108 is important. The metalization comprises metal interconnect using conductive inks to create the circuit lines 102, 103, and 108. The electronic unit 104 and processor chip 105 are connected by the conductive lines 102. The processor chip 105 and battery 106 are connected by the conductive lines 103. The processor chip 105 and antenna 107 are connected by the conductive line 108. The battery 105 provides power to the processor chip 105 and the electronic unit 104. The antenna 107 allows information that has been obtained by the system 100 to be transmitted to a remote receiver.

The drawings and written description illustrate a number of specific embodiments of the invention. These embodiments and other embodiments give a broad illustration of the invention. Various changes and modifications within the spirit and scope of the invention will become apparent to those skilled in the art. Applicants will describe four (4) embodiments of creating the circuit lines 102, 103, and 108. The first method utilizes "3D Microfluidic Networks."

In one embodiment, applicants produce three-dimensional microfluidic channels in the PDMS substrate 101. Applicants then fill the microfluidic networks with liquid conductive ink. Applicants then cure the ink to produce embedded conducting networks within the PDMS substrate 101. A syringe is used to inject the ink into the channels to allow for an even distribution throughout the structure. Alternatively, a vacuum can be used to draw the ink through the microfluidic network. After the ink is dispersed throughout the channels it is then cured producing conductive micron-scale wires.

In a preliminary experiment, a set of four channels with different diameters was created in a 49 mm long block of PDMS with the conductive ink (Conductive Compounds, AG-500, silver filled electrically conductive screen printable ink/coating) injected into each channel. Channel sizes ranged from 100 microns to 378 microns in diameter. After curing, all four lines were found to be electrically continuous.

The Microfluidic Networks can be produce as described in International Patent No. WO0189787 published Nov. 29, 2001 and May 30, 2002, titled "MICROFLUIDIC SYSTEMS INCLUDING THREE-DIMENSIONALLY ARRAYED CHANNEL NETWORKS," to the President and Fellows of Harvard College invented by Anderson et al. This patent describes methods for fabricating improved microfluidic systems, which contain one or more levels of microfluidic channels. The microfluidic channels can include three-dimensionally arrayed networks of fluid flow paths therein including channels that cross over or under other channels of the network without physical intersection at the points of cross over. The microfluidic networks of the can be fabricated via replica molding processes. International Patent No. WO0189787 and the information and disclosure provided thereby is incorporated herein by reference.

In another embodiment, applicants produce three-dimensional microfluidic channels in the PDMS substrate 101 using a stamp to place the ink in a desired pattern on layers of PDMS. A description of a deformable stamp for patterning a surface is shown in U.S. Patent Application No. 2002/0050220 for a deformable stamp for patterning three-dimensional surfaces by Olivier Schueller, Enoch Kim, and George Whitesides published May 5, 2002. U.S. Patent Application No. 2002/0050220 is incorporated herein by reference.

The stamp can be placed in contact with an entire 3-dimensional object, such as a rod, in a single step. The stamp can also be used to pattern the inside of a tube or rolled over a surface to form a continuous pattern. The stamp may also be used for fluidic patterning by flowing material through channels defined by raised and recessed portions in the surface of the stamp as it contacts the substrate. The stamp may be used to deposit self-assembled monolayers, biological materials, metals, polymers, ceramics, or a variety of other materials. The patterned substrates may be used in a variety of engineering and medical applications. This approach can be used to pattern the conductive inks to produce multi level metalization as follows:

1. An etched substrate of silicon, glass, or comparable type is used to mold the PDMS to a desired pattern. Photoresist or other material can also be patterned onto the silicon or glass substrate to create the mold.
2. The PDMS is applied on the mold, allowed to cure and then peeled away from the substrate forming a stamp.
3. The conductive ink is then spin coated onto a second application wafer to achieve a thin coating.
4. The PDMS stamp is then applied to this wafer allowing for the ink to transfer from the application wafer to the stamp.
5. The PDMS stamp with the ink applied to it is aligned with the PDMS-coated substrate wafer and placed in contact, then removed, transferring the ink.
6. The ink is then allowed to cure at the appropriate temperature for proper adhesion.
7. Once the ink is cured a layer of photoresist is applied and patterned to produce posts that will form the interconnects between metal layers. This is done using photolithography techniques.
8. A second layer of PDMS is applied to the substrate wafer to passivate the first layer of metal without exceeding the height of the photoresist posts.
9. After curing the PDMS, the photoresist posts are removed in acetone, leaving vias down to the underlying metal layer.
10. The holes are filled either by filling with conductive ink or by electroplating.
11. For multi-layer metalization steps 3-11 are repeated until the desired number of levels are achieved.

Another embodiment of a system for creating the circuit lines 102, 103, and 108 is photolithography. Photoresist is spun onto the substrate wafer and patterned, exposing the underlying PDMS layer in regions where the conductive ink is to be applied. The conductive ink is then spread onto the substrate, either by spin-coating or spraying. After curing, the photoresist is removed in acetone, lifting off the undesired conductive ink. This process can be replicated until the desired levels are completed.

Another embodiment of a system for creating the circuit lines 102, 103, and 108 is screen printing. To avoid the use of photoresist and the possibility of losing excessive amounts of ink in the photolithography process, the ink can simply be screen printed on using traditional techniques. A permeable screen mesh of either monofilament polyester or stainless steel is stretched across a frame. The frame with a stencil with the desired pattern is placed on top of the wafer with cured PDMS. Using a squeegee the conductive ink is pushed through the stencil and onto the substrate wafer. Another screen mesh with stencil is used to apply the appropriate interconnections for each layer of metalization. After which a second layer of PDMS is applied to the substrate wafer to passivate the first layer of metal without exceeding the height of the metal interconnections. This process is repeated until the desired number of levels is achieved.

Figure 2:
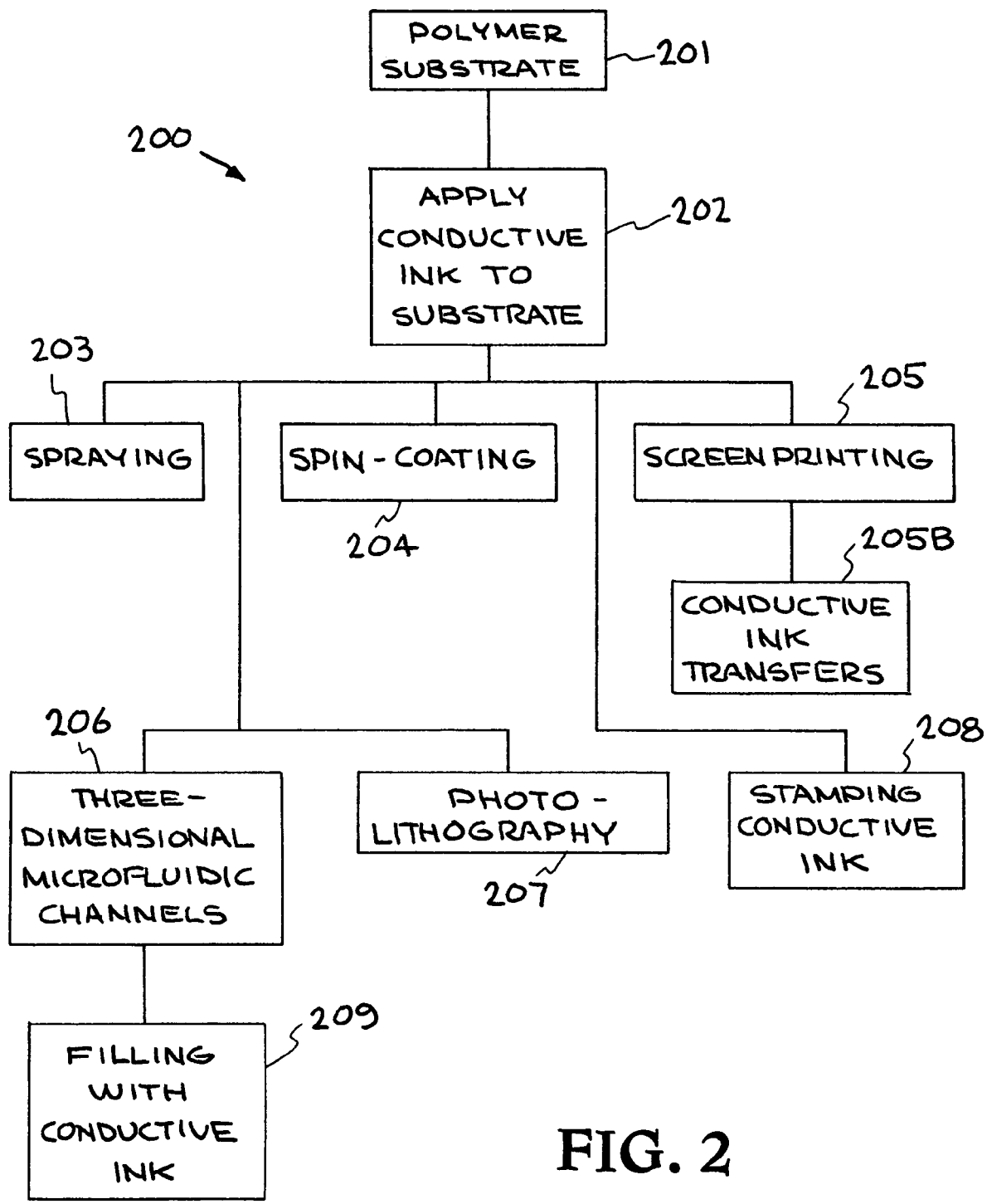
FIG. 2 illustrates another embodiment of a system incorporating the present invention.

Referring now to FIG. 2, another embodiment of a system constructed in accordance with the present invention is illustrated. The system provides an electronic apparatus. The system is generally designated by the reference numeral 200. In the system 200 the electronic apparatus is produced by the steps (201) providing a flexible polymer substrate and (202) applying conductive ink to the flexible polymer substrate. Circuit lines are produced by applying the conductive ink to the flexible polymer substrate. In one embodiment the flexible polymer substrate is silicone. In another embodiment the flexible polymer substrate comprises poly(dimethylsiloxane).

The electronic apparatus can be a wide variety of electronic devices. Some examples of electronic apparatus that can be produced include, but are not limited to, the following: electrode array, implantable medical device, radio, recorder, recorder and player, video camera, video player, video recorder, video recorder and player, cell phone, computer, calculator, phone tap, gadget that detects phone taps, audio surveillance device, medical device, biosensor, radiation monitor, power source, battery, solar cell, wireless electronics for communication, capacitor, resistor, inductor, transformer, integrated circuit, microprocessor, digital to analog converter, display, camera, cell phone, and other electronic devices. Devices are attached to an activated flexible polymer substrate. In the case of PDMS substrates both the substrate and the device passivating oxide are cleaned in ethanol prior to an oxygen plasma. Devices are then permanently bonded to the substrate upon contact.

FIG. 2 shows six different embodiments of steps for applying the conductive ink to the flexible polymer substrate to create the circuit lines. The six different steps of applying the conductive ink to the flexible polymer substrate are: step 203 spraying, step 204 spin-coating, step 205 screen printing, step 206 creating three-dimensional microfluidic channels, 207 photolithography, and 208 stamping.

In step 203 spraying, photoresist is spun onto the flexible polymer substrate and patterned. This exposes the underlying flexible polymer substrate layer in regions where the conductive ink is to be applied. The conductive ink is then spread onto the flexible polymer substrate by spraying. After curing, the photoresist is removed in acetone, lifting off the undesired conductive ink. This process can be replicated until the desired levels are completed.

In step 204 spin-coating, photoresist is spun onto the flexible polymer substrate and patterned, exposing the underlying flexible polymer substrate layer in regions where the conductive ink is to be applied. The conductive ink is then spread onto the flexible polymer substrate by spin-coating. After curing, the photoresist is removed in acetone, lifting off the undesired conductive ink. This process can be replicated until the desired levels are completed.

In step 205 screen printing, the conductive ink is screen printed using traditional techniques. A permeable screen mesh of either monofilament polyester, polyamide or stainless steel is stretched across a frame. The frame with a stencil with the desired pattern is placed on top of the flexible polymer substrate. Using a squeegee the conductive ink is pushed through the stencil and onto the subsequent flexible polymer substrate. Another screen mesh with stencil is used to apply the appropriate interconnections for each layer of metalization. After which a second layer of flexible polymer substrate is applied to the flexible polymer substrate to passivate the first layer of ink/metal without exceeding the height of the metal interconnections. This process is repeated until the desired number of levels is achieved. Stencil types can be direct or indirect mechanical or photomechanical.

In step 205*b* screen printed interconnect transfers, the conductive ink is screen printed as in step 205 onto a carrier backing material such as mylar or Kapton. The ink is cured before it is transferred in a decal fashion onto the flexible polymer substrate. Multilple conductive ink transfer decals with fiducial alignment marks are used to complete multiple interconnect routing levels.

In step 206 creating three-dimensional microfluidic channels, three-dimensional microfluidic channels are created in the flexible polymer substrate. The microfluidic networks are filled with liquid conductive ink. The ink is cured to produce embedded conducting networks within the flexible polymer substrate. A syringe can be used to inject the ink into the channels to allow for an even distribution throughout the structure. Alternatively, a vacuum can be used to draw the ink through the microfluidic network.

In step 207 photolithography, the circuit lines are created using photolithography. Photoresist is spun onto the flexible polymer substrate and patterned, exposing the underlying flexible polymer substrate layer in regions where the conductive ink is to be applied. The conductive ink is then spread onto the flexible polymer substrate. After curing, the photoresist is removed in acetone, lifting off the undesired conductive ink. This process can be replicated until the desired levels are completed.

In step 208 a stamp is used to place the ink in a desired pattern on layers of PDMS. The stamp can be placed in contact with an entire 3-dimensional object, such as a rod, in a single step. The stamp can also be used to pattern the inside of a tube or rolled over a surface to form a continuous pattern. The stamp may also be used for fluidic patterning by flowing material through channels defined by raised and recessed portions in the surface of the stamp as it contacts the flexible polymer substrate. The stamp may be used to deposit self-assembled monolayers, biological materials, metals, polymers, ceramics, or a variety of other materials.

Figure 3:
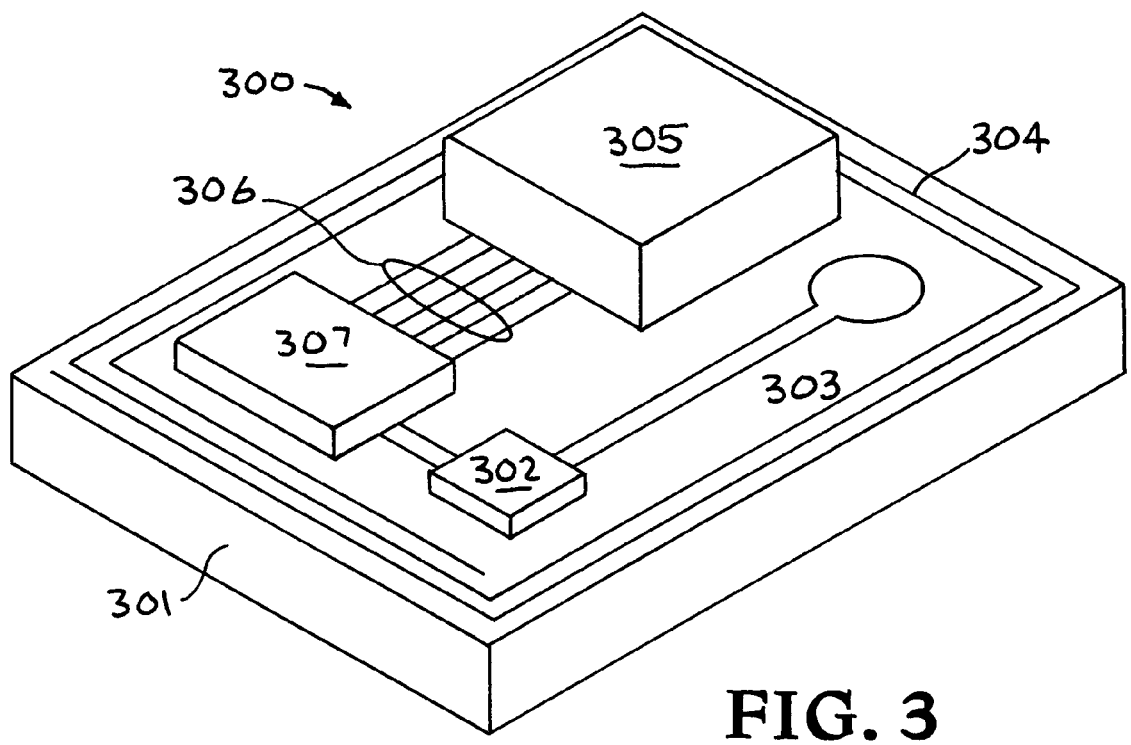
FIG. 3 illustrates another embodiment of a system incorporating the present invention.

Referring now to FIG. 3, another embodiment of a system constructed in accordance with the present invention is illustrated. This embodiment is generally designated by the reference numeral 300. Integrated microsystems are expected to play an increasingly important role in Homeland Security.

Examples of such integrated microsystems include: microfluidic systems for chem/bio threat detection, distributed sensors for tracking terrorist activities, radiation detectors, and cargo container monitoring devices. These Integrated microsystems require small, low cost, rugged, field-operable devices. Deployable sensors with wireless communication capability are required for numerous counter-terrorism and intelligence applications. Examples include monitoring cargo shipments, tracking troop, individual personnel, and vehicle movement, and detecting chemical and biological signatures associated with various threats. These sensor modules must meet several requirements for widespread deployment. They need to be inexpensive, rugged for air-drop deployment and abusive conditions, inconspicuous, able to withstand severe environmental factors (temperature extremes, water submersion), and self-sufficient (integrated power, electronics, sensing, and communications).

The embodiment 300 comprises a PDMS body 301, an optical sensor 302, a microfluidic channel 303, an antenna 304, a MEMS sensor 305, and an Application-Specific Integrated Circuit (ASIC) 307. The optical sensor 302, microfluidic channel 303, antenna 304, MEMS sensor 305, and Application-Specific Integrated Circuit (ASIC) 307 are operatively connected to the PDMS body 301. Metal traces circuits 306 are integrated into the PDMS body 301 that connect the optical sensor 302, microfluidic channel 303, antenna 304, MEMS sensor 305, and Application-Specific Integrated Circuit (ASIC) 307.

The metal traces circuits 306 are integrated into the PDMS body 301 by various methods. In one embodiment the metal traces circuits 306 are integrated into the PDMS body 301 by applying conductive ink to the PDMS body 301. In another embodiment the metal traces circuits 306 are integrated into the PDMS body 301 by producing three-dimensional microfluidic channels in the flexible polymer substrate and filling the three-dimensional microfluidic channels with the conductive ink. The conductive ink cured to produce the circuit lines. In another embodiment the three-dimensional microfluidic channels are filled with the conductive ink by injecting the conductive ink into the three-dimensional microfluidic channels. In another embodiment the three-dimensional microfluidic channels are filled with the conductive ink by injecting the conductive ink into the three-dimensional microfluidic channel using a syringe. In another embodiment the three-dimensional microfluidic channels are filled with the conductive ink by injecting the conductive ink into the three-dimensional microfluidic channels using a vacuum to draw the conductive ink through the three-dimensional microfluidic channels.

In another embodiment the metal traces circuits 306 are integrated into the PDMS body 301 by applying conductive ink to the flexible polymer substrate using a stamp to place the conductive ink in a desired pattern on the flexible polymer substrate. In another embodiment the metal traces circuits 306 are integrated into the PDMS body 301 by applying conductive ink to the flexible polymer substrate using photolithography. In another embodiment the metal traces circuits 306 are integrated into the PDMS body 301 by spreading the conductive ink onto the flexible polymer substrate. In another embodiment the metal traces circuits 306 are integrated into the PDMS body 301 by spreading the conductive ink onto the flexible polymer substrate by spin-coating.

In another embodiment the metal traces circuits 306 are integrated into the PDMS body 301 by spreading the conductive ink onto the flexible polymer substrate by spraying. In another embodiment the metal traces circuits 306 are integrated into the PDMS body 301 by screen printing. In another embodiment the screen printing uses a permeable screen mesh. In another embodiment the screen printing uses a permeable screen mesh of monofilament polyester. In another embodiment the screen printing uses a permeable screen mesh of stainless steel.

In another embodiment the screen printing uses a screen mesh of polyamide. In another embodiment the screen printing uses a mechanical stencil of a direct type. In another embodiment the screen printing uses a mechanical stencil of an indirect type. In another embodiment the screen printing uses a photomechanical stencil of a direct type. In another embodiment the screen printing uses a photomechanical stencil of an indirect type. In another embodiment the screen printing uses screen printed interconnect transfers. In another embodiment the screen printing uses conductive ink screen printed onto a carrier backing material. In another embodiment the carrier backing material is mylar. In another embodiment the carrier backing material is Kapton.

In another embodiment the metal traces circuits 306 are integrated into the PDMS body 301 by applying conductive ink to the PDMS body 301 and the conductive ink is cured and transferred in a decal fashion onto the flexible polymer substrate. In another embodiment the metal traces circuits 306 are integrated into the PDMS body 301 by applying conductive ink to the PDMS body 301 and the conductive ink is cured and transferred in a decal fashion onto the flexible polymer substrate using multilple conductive ink transfer decals with fiducial alignment marks to complete multiple interconnect routing levels.

The embodiment 300 comprises a polymer-based platform that will enable the development of hybrid microsystems with integrated sensors, electronics, optical elements, power, and microfluidics. The platform is capable of incorporating off-the-shelf components as well as custom fabricated devices, and features a low cost packaging approach. Polydimethylsiloxane (PDMS) serves as the integration backbone, with microfluidic structures molded into the silicone polymer, and other components such as silicon sensors and circuits directly bonded to the PDMS, forming a leak-proof seal. Electrical traces are patterned on the PDMS to interconnect the various components. The ACIC chip 307 and the other components are irreversibly bonded to the PDMS substrate 301 to make electrical contact to the metal traces 306 and seal the device 300, protecting active elements from the environment. The antenna 304 facilitates communication with a remote receiver.

Figure 4A:
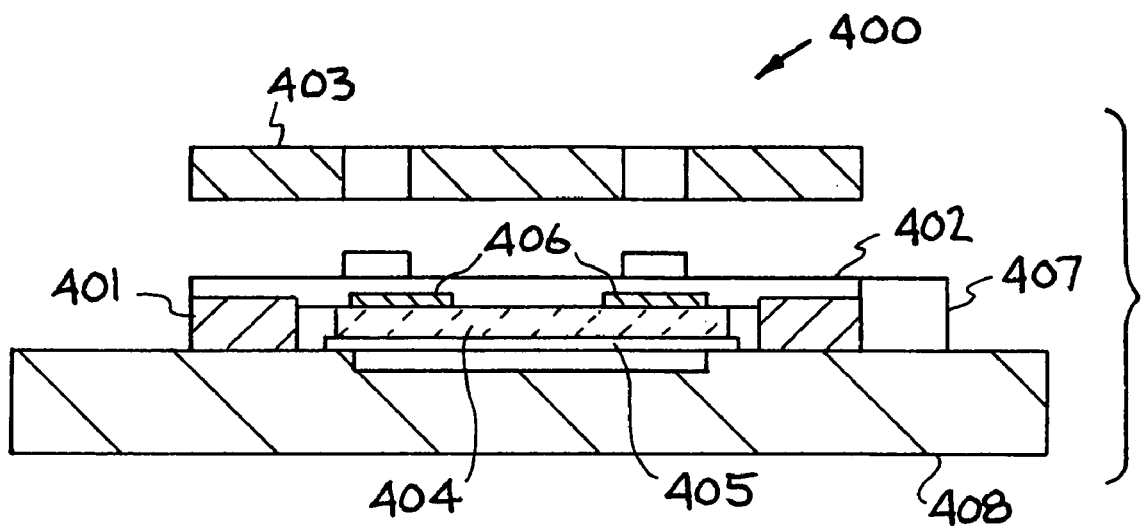
FIGS. 4A and 4B illustrate an embodiment of an alignment apparatus used in screen printing multiple layers of metalization.
Figure 4B:
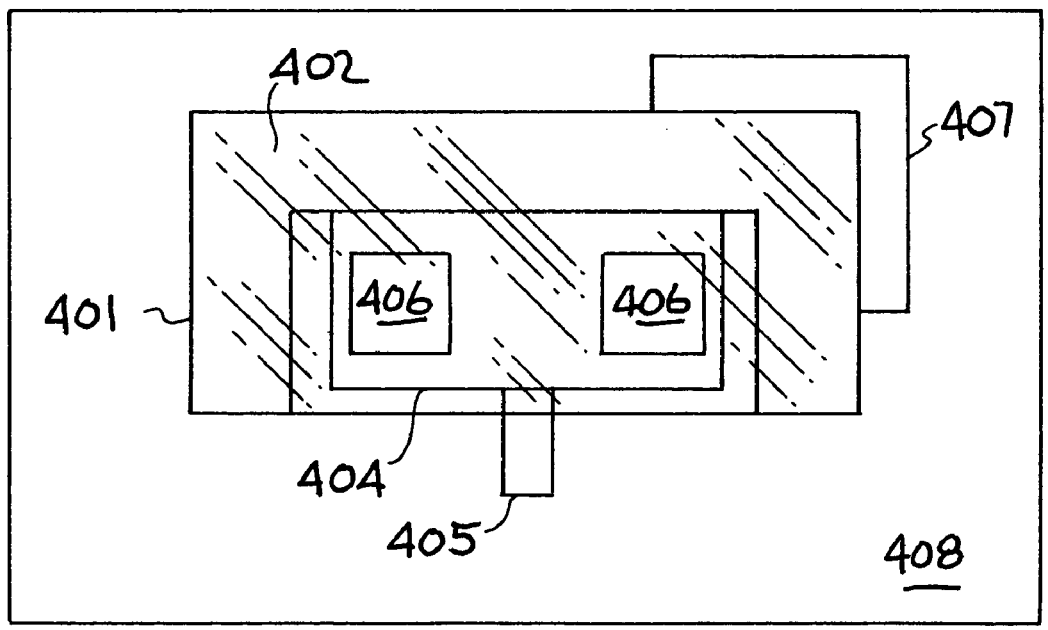

Referring now to FIGS. 4A and 4B, an embodiment of an alignment system used in screen printing multiple layers of metalization is illustrated. The system is designated generally by the reference numeral 400 and is includes a transparent hard surface and spacers calibrated to suspend the transparent surface a few microns above the substrate to be printed. In one embodiment the spacers are variable in height to accommodate arbitrary substrate thickness. FIG. 4A is a side view and FIG. 4B is a plan view of the alignment system 400. FIGS. 4A and 4B depict the alignment process.

Metalization required for integrated polymer microsystems are either single level (layer) or multiple levels depending on the complexity of the device. As in conventional photolithography, an electrically insulating layer is applied between each layer of metalization. The first layer is often placed arbitrarily on the substrate while subsequent layers require registration of features to the first base layer. Typical screen printing emulsions are fairly opaque and are by nature of the machine hardware between the operator and the substrate making visible alignment extremely difficult if not impossible.

As shown in FIG. 4A, the alignment system 400 comprises a number of components and elements of the device being produced. The following elements and components are included: a spacer 401, a transparent surface 402 such as glass or rigid plastic such as Plexiglas, printing screen 403, substrate 404, thin substrate positioner/carrier, first metal layer 406, fixed placement guide 407, vacuum table 408, and screen alignment on transparent surface transfer.

The first alignment step is to roughly position the alignment apparatus on the vacuum table 408 such that it is oriented to the pattern on the printing screen. A placement guide is then fixed to the table 408 for subsequent removal and exact repositioning of the alignment apparatus. Next ink is screen printed onto the transparent surface producing a registration pattern for subsequent alignment of the substrate. The substrate 404 is placed on a piece of Mylar, Kapton, or other thin material, which is used as a carrier and positioner 405. The carrier is perforated to permit vacuum pull down on the substrate. The substrate is then positioned under the transparent surface 402 and aligned to features on the substrate surface such as first or subsequent layers of metalization. After the substrate is properly registered to the pattern on the transparent surface the alignment apparatus is removed from the table and the vacuum is turn on securing the substrate.

The substrate is now ready for screen printing of an aligned pattern. After printing the substrate is removed and the alignment apparatus is replaced on the surface accurately as it is pushed up against the placement guide. Now another substrate is placed on the carrier and aligned as detailed above. The entire process is repeated for each subsequent substrate to be printed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

The invention claimed is:

1. A method of producing an electronic unit having a poly(dimethylsiloxane) substrate body, an electronic device in the poly(dimethylsiloxane) substrate body, a power source in the poly(dimethylsiloxane) substrate body, and electronic circuit lines connecting the electronic device and the power source, comprising the steps of:

providing a poly(dimethylsiloxane) substrate to produce the poly(dimethylsiloxane) substrate body, providing an electronic device in the poly(dimethylsiloxane) substrate body, providing a power source in the poly(dimethylsiloxane) substrate body, producing three-dimensional microfluidic channels in said poly(dimethylsiloxane) substrate body connecting the electronic device and the power source, providing conductive ink, and filling said three-dimensional microfluidic channels with said conductive ink by applying conductive ink to said three-dimensional microfluidic channels in the poly(dimethylsiloxane) substrate body to form the electronic circuit lines.

2. The method of producing an electronic unit having a poly(dimethylsiloxane) substrate body, an electronic device in the poly(dimethylsiloxane) substrate body, a power source in the poly(dimethylsiloxane) substrate body, and electronic circuit lines connecting the electronic device and the power source of claim 1 including the step of curing said conductive ink to produce embedded conducting networks within said poly(dimethylsiloxane) substrate body.

3. The method of producing an electronic unit having a poly(dimethylsiloxane) substrate body, an electronic device in the poly(dimethylsiloxane) substrate body, a power source in the poly(dimethylsiloxane) substrate body, and electronic circuit lines connecting the electronic device and the power source of claim 1 wherein said step of filling said three-dimensional microfluidic channels with said conductive ink comprises injecting said conductive ink into said three-dimensional microfluidic channels.

4. The method of producing an electronic unit having a poly(dimethylsiloxane) substrate body, an electronic device in the poly(dimethylsiloxane) substrate body, a power source in the poly(dimethylsiloxane) substrate body, and electronic circuit lines connecting the electronic device and the power source of claim 1 wherein said step of filling said three-dimensional microfluidic channels with said conductive ink comprises injecting said conductive ink into said three-dimensional microfluidic channels using a syringe.

5. The method of producing an electronic unit having a poly(dimethylsiloxane) substrate body, an electronic device in the substrate body, a power source in the substrate body, and electronic circuit lines connecting the electronic device and the power source of claim 1 wherein said step of filling said three-dimensional microfluidic channels with said conductive ink comprises using a vacuum to draw said conductive ink through said three-dimensional microfluidic channels.

* * * * *